(12) United States Patent
Ryu et al.

(10) Patent No.: US 7,211,524 B2
(45) Date of Patent: May 1, 2007

(54) METHOD OF FORMING INSULATING LAYER IN SEMICONDUCTOR DEVICE

(75) Inventors: Choon Kun Ryu, Seoul (KR); Tae Kyung Kim, Ichon-Shi (KR)

(73) Assignee: Hynix Semiconductor Inc., Kyungki-do (KR)

( * ) Notice: Subject to any disclaimer, the term of this patent is extended or adjusted under 35 U.S.C. 154(b) by 0 days.

(21) Appl. No.: 10/310,143

(22) Filed: Dec. 5, 2002

(65) Prior Publication Data
US 2003/0216027 A1 Nov. 20, 2003

(30) Foreign Application Priority Data
May 17, 2002 (KR) .................... 10-2002-0027478

(51) Int. Cl.
*H01L 21/31* (2006.01)
*H01L 21/469* (2006.01)

(52) U.S. Cl. .................... 438/778; 438/786; 438/788; 257/E21.277

(58) Field of Classification Search ................ 438/778, 438/786, 788; 257/E21.277
See application file for complete search history.

(56) References Cited

U.S. PATENT DOCUMENTS

| | | | |
|---|---|---|---|
| 6,041,734 A * | 3/2000 | Raoux et al. ............ 118/723 E |
| 6,440,876 B1 * | 8/2002 | Wang et al. ................ 438/778 |
| 6,479,110 B2 | 11/2002 | Grill et al. | |
| 6,537,928 B1 * | 3/2003 | Matsuki et al. ............. 438/788 |
| 6,572,923 B2 * | 6/2003 | Ma et al. ................ 427/255.27 |
| 6,627,532 B1 | 9/2003 | Gaillard et al. | |
| 2002/0111423 A1 * | 8/2002 | Paik et al. .................. 524/739 |
| 2002/0168870 A1 * | 11/2002 | Matsuki ...................... 438/778 |
| 2003/0155074 A1 * | 8/2003 | Yao ........................ 156/345.26 |

FOREIGN PATENT DOCUMENTS

KR 2002-27269 4/2002

* cited by examiner

*Primary Examiner*—Fernando L. Toledo
(74) *Attorney, Agent, or Firm*—Lowe Hauptman & Berner LLP

(57) ABSTRACT

The present invention relates to a method of forming an insulating film in a semiconductor device. After a mixed gas of alkyl silane gas and $N_2O$ gas is supplied into the deposition equipment, a radio frequency power including a short pulse wave for causing incomplete reaction upon a gas phase reaction is applied to generate nano particle. The nano particle is then reacted to oxygen radical to form the insulating film including a plurality of nano voids. A low-dielectric insulating film that can be applied to the nano technology even in the existing LECVD equipment is formed.

18 Claims, 2 Drawing Sheets

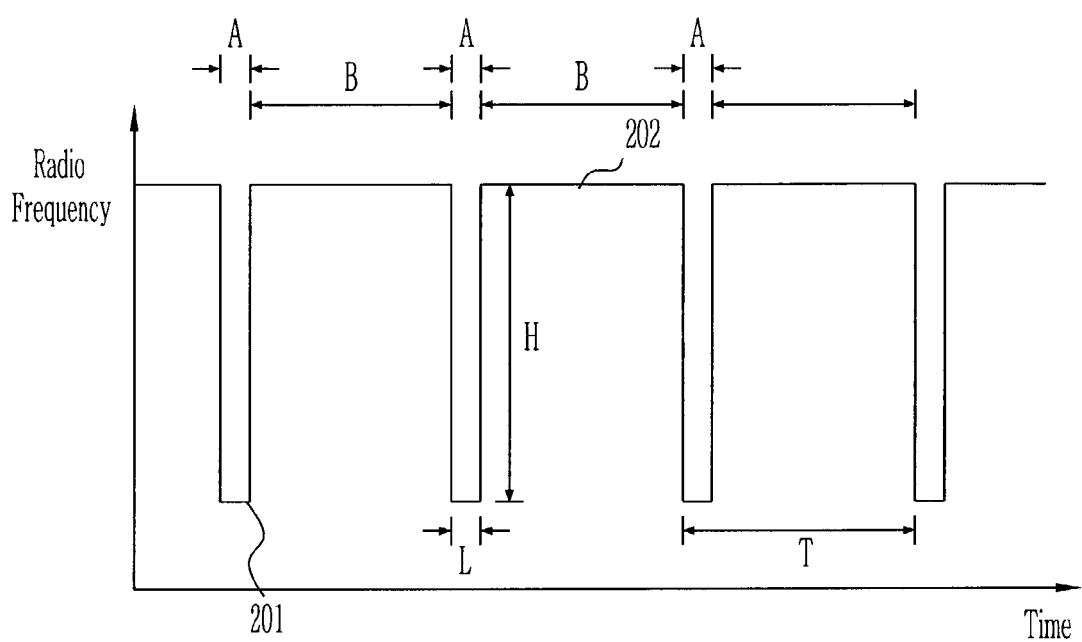

METHOD OF FORMING INSULATING LAYER IN SEMICONDUCTOR DEVICE

BACKGROUND OF THE INVENTION

1. Field of the Invention

The invention relates generally to a method of forming an insulating film in a semiconductor device. More particularly, the invention relates to a method of forming an insulating film in a semiconductor device by which a low-dielectric insulating film that will be applied to the nano technology in the deposition equipment including the existing PECVD (plasma enhanced chemical vapor deposition) equipment.

2. Description of the Prior Art

As the level of integration in the semiconductor device is increased, a metal line is formed in multiple layers. In order to electrically insulate these lines, an inter-metal line insulating film is formed between the metal line layers. The dielectric constant of the inter-metal line insulating film is changed depending on the type of materials. The performance of the device is dependent on the dielectric constant. In other words, the inter-line insulating film is formed between the upper line and the lower line. The semiconductor device has the same structure to the capacitor. With this structure, the parasitic capacitor is formed and the parasitic capacitor degrades the operating speed of the device. As a result, in order to minimize electrical characteristics of the device affected by the parasitic capacitor, it is required that the dielectric constant be lowered by lowering the inter-line insulating film using a thin low-dielectric film.

In the manufacture process of the semiconductor device, a method of forming the inter-line insulating film having a low dielectric constant includes one by which hydrocarbon ($CH_3$) of a silica network structure is doped in order to increase porosity. However, if the concentration of hydrocarbon is increased, it is difficult to lower the dielectric constant below 2.7 since thermal stability and mechanical strength of the film are degraded.

Meanwhile, if the low-dielectric insulating film is formed by means of a conventional spin-on method, there are drawbacks that it is difficult to control the fine structure of the film and the mechanical strength of the film is weak compared to the CVD method.

SUMMARY OF THE INVENTION

The present invention is contrived to solve the above problems and an object of the present invention is to provide a method of forming an insulating film in a semiconductor device by which a low-dielectric insulating film that can be applied to the nano technology can be formed even using the existing deposition equipment. To this end, after a mixed gas of alkyl silane gas and $N_2O$ gas is supplied into the deposition equipment, a radio frequency power including a short pulse wave for causing incomplete reaction in a gas phase reaction is applied to generate nano particles. Nano particles are then reacted to oxygen radical to form the insulating film containing a plurality of nano void.

The above object of the present invention is achieved by a method of forming an insulating film in a semiconductor device according to the present invention comprising the steps of mounting the semiconductor substrate in which a lower structure is formed into a deposition equipment, supplying a source gas containing silicon component and a reaction gas containing oxygen component into the deposition equipment, applying a radio frequency power including a short pulse wave for causing incomplete reaction upon a gas phase reaction, generating incomplete gas phase reaction during the time when the short pulse of the radio frequency power is applied, so that an insulating film including nano particles are deposited, and oxidizing the nano particle during the time when the short pulse of the radio frequency power is not applied, so that nano void is formed within the insulating film.

The method further comprises the step of after the semiconductor substrate is mounted on to the deposition equipment, controlling an internal pressure of the deposition equipment to be a deposition pressure while injecting insert gas into the deposition equipment before the source gas and the reaction gas are supplied.

In the above, the source gas includes alkyl silane gas, the alkyl silane gas includes tri-methylsilane ($SiH(CH_3)_3$) gas or tetra-methylsilane; $SiH(CH_3)_4$ gas, and the flow rate of supplying alkyl silane gas is 200 through 1000 sccm. Meanwhile, $N_2O$ gas is used as the reaction gas and the flow rate of supplying the reaction gas is 1000 through 5000 sccm.

The radio frequency power is a mixed radio frequency power in which the first radio frequency power consisting of the short pulse wave having a low amplitude and a second radio frequency power for a background having a high amplitude. At this time, the first radio frequency power is 100 through 300 W and the second radio frequency power is 500 through 2000 W.

Meanwhile, the size and distribution of the nano particle are controlled by adjusting the first radio frequency power, the size of the nano particle is controlled by adjusting the pulse width of the first radio frequency power, and the degree that the gas phase reaction is formed by incomplete reaction is controlled in order to control the amplitude of the first radio frequency power.

The nano particle is made of $SiC_xH_y$ and the insulating film is made of SiOCH.

BRIEF DESCRIPTION OF THE DRAWINGS

The aforementioned aspects and other features of the present invention will be explained in the following description, taken in conjunction with the accompanying drawings, wherein:

FIG. 2 is a graph illustrating a waveform of the radio frequency power applied during the process of forming the insulating film.

DETAILED DESCRIPTION OF PREFERRED EMBODIMENTS

The present invention will be described in detail by way of a preferred embodiment with reference to accompanying drawings.

Figure 1A:
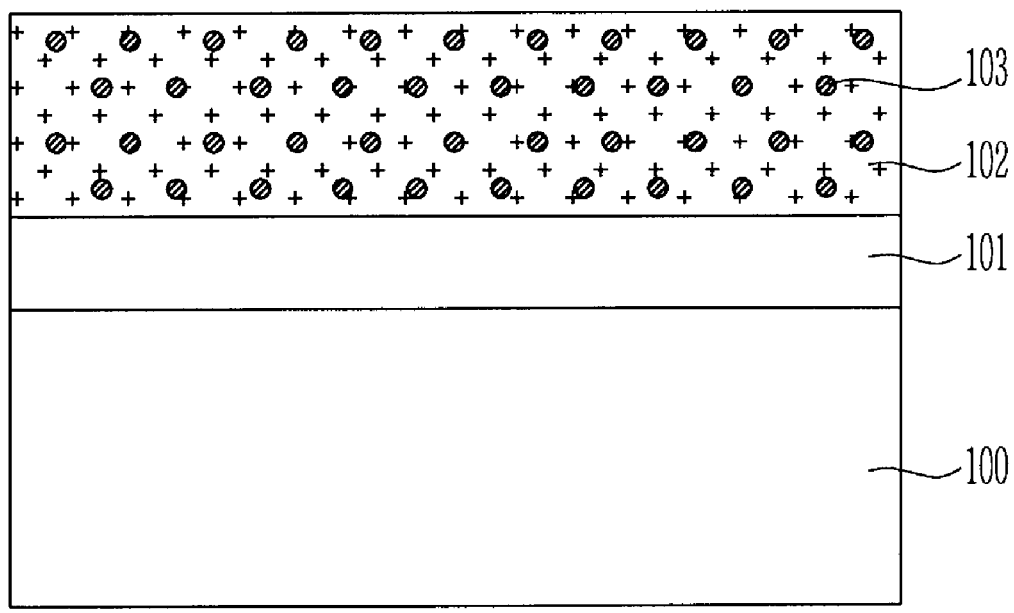
FIG. 1A and FIG. 1B are cross-sectional views of semiconductor devices for explaining a method of forming an insulating film in the semiconductor device according to a preferred embodiment of the present invention.
Figure 1B:
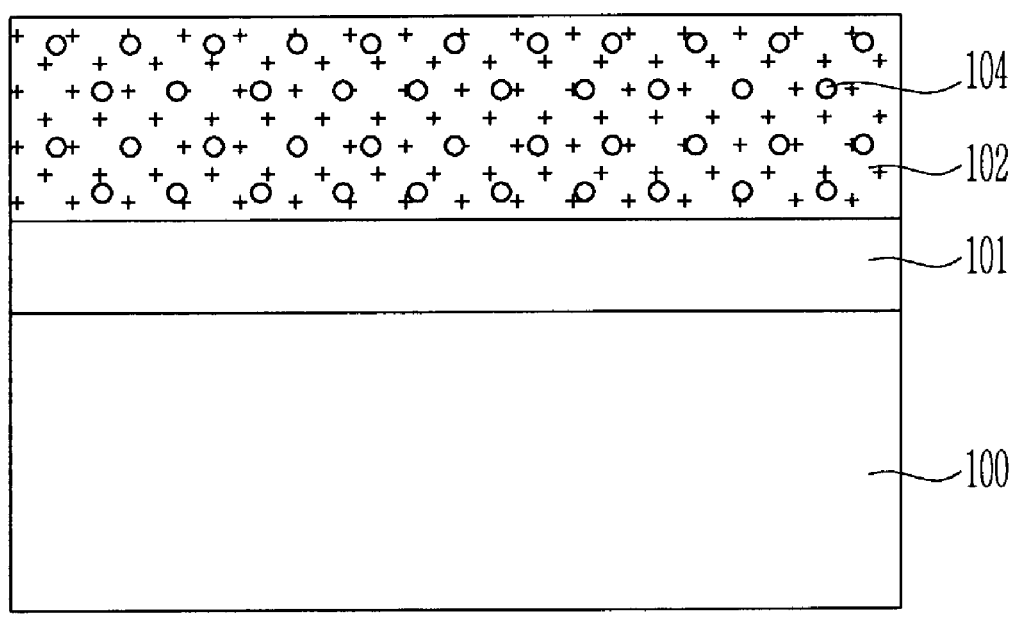

FIG. 1A and FIG. 1B are cross-sectional views of semiconductor devices for explaining a method of forming an insulating film in the semiconductor device according to a preferred embodiment of the present invention, and FIG. 2 is a graph illustrating a waveform of the radio frequency power applied during the process of forming the insulating film.

Referring now to FIG. 1A, a semiconductor substrate 100 in which a lower structure 101 such as a transistor, a metal line, a capacitor and a memory cell is formed is mounted on the deposition equipment (not shown).

After the semiconductor substrate 100 is mounted, insert gas such as He or Ar is supplied into the deposition equipment to control the reaction pressure. At this time, it is preferred that the inert gas is supplied at a flow rate of 500 through 5000 sccm and an internal pressure of the deposition equipment is controlled to 2 through 10 Torr.

After the internal pressure of the deposition equipment is controlled to a target pressure, a source gas containing silicon component and a reaction gas containing oxygen component are supplied into the deposition equipment. At this time, alkyl silane gas such as tri-methylsilane; $SiH(CH_3)_3$ or (tetramethylsilane; $SiH(CH_3)_4$) may be used as the source gas and $N_2O$ gas may be used as the reaction gas. Further, a flow rate for supplying alkyl silane gas is set to 200 through 1000 sccm and a flow rate for supplying $N_2O$ gas is set to 1000 through 5000 sccm.

Thereafter, in order to form an insulating film, a radio frequency power is applied, wherein a radio frequency power including a short pulse wave is applied so that nano particle can be formed within the insulating film by causing incomplete reaction during the gas phase reaction An example of the radio frequency power applied to the deposition equipment will be described by reference to the waveform graph of the radio frequency power shown in FIG. 2.

Referring now to FIG. 2, the radio frequency power applied so that the nano particle 103 is formed within the insulating film 102 includes a first radio frequency power 201 consisting of the short pulse wave having a low amplitude (H), and a second radio frequency power 202 for a background having a high amplitude.

In other words, after the source gas and the reaction gas are supplied into the deposition equipment, a mixed radio frequency power in which the first radio frequency power 201 consisting of the short pulse wave having a low amplitude 'H' is mixed with the second radio frequency power 202 for a background having a high amplitude. At this time, it is preferred that the first radio frequency power 201 is 100 through 300 W and the second radio frequency power 202 is 500 through 2000 W. The first and second radio frequency power is applied to the showerhead of the deposition equipment.

As above, if the radio frequency power including the short pulse wave is applied, the gas phase reaction is incompletely made in a period 'A' wherein the mixed radio frequency power is lowered by the first radio frequency power 201 containing the short pulse wave. Due to this, a chemical reaction as in chemical equation 1 below is caused, so that the nano particle 103 is formed within the insulating film 102.

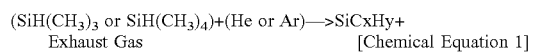
[Chemical Equation 1]

As in Equation 1, if the first radio frequency power 201 containing the short pulse wave is applied in a short period of time, the gas phase reaction is incompletely made. In the process wherein the insulating film 102 is deposited, the nano particle 103 such as SiCxHy is thus formed within the insulating film 102. Thereby, the insulating film 102 containing the nano particle 103 is formed.

At this time, the size and distribution of the nano particle 103 can be controlled by adjusting the pulse width 'L' and the wavelength of the first radio frequency power 201. The size of the nano particle 103 is in proportion to the pulse width 'L' of the first radio frequency power 201. Thus, if the is pulse width 'L' of the first radio frequency power 201 is increased, the size of the nano particle 103 is increased. On the contrary, if the pulse width 'L' of the first radio frequency power 201 is reduced, the size of the nano particle 103 is reduced.

Further, distribution of the nano particle 103 existing in the insulating film 102 is controlled depending on the period 'T' during which the pulse is applied. The nano particle 103 is formed while the insulating film 102 is deposited. Thus, as the period 'T' during which the pulse is applied lengthen, the density of the nano particle 103 is reduced. On the contrary, as the period shortens, the density of the nano particle 103 is increased.

Meanwhile, if the amplitude 'H' is increased since the first radio frequency power 201 is applied with a too high value, regions in which incomplete reaction occurred are increased in the insulating film. In this case, it is impossible to form a normal insulating film. On the contrary, if the amplitude 'H' is reduced since the first radio frequency power 201 is applied with a too low value, regions in which incomplete reaction occurred are reduced in the insulating film since the power rarely affects the second radio frequency power 202. Thus, the nano particle is almost not formed.

As a result, as the size and quantity of the nano particle 103 decide the size and quantity of nano void that will be formed in the insulating film 102, the first radio frequency power 201 must be applied with an adequate value depending on the process conditions so that the nano particle 103 of target size and quantity can be formed within the insulating film 102.

Referring now to FIG. 1B and FIG. 2, in a period 'B' wherein the first radio frequency power 201 does rarely affect and only the second radio frequency power 202 is applied, the nano particle 103 within the insulating film 102 is reacted to oxygen radical, so that a nano void 104 is formed while the nano particle 103 is changed to an insulating material such as SiOCH as in a chemical equation 2 below.

[Chemical Equation 2]

As the first and the second radio frequency power 201 and 202 are periodically iteratively applied, the step of forming the nano particle and the step of forming nano void are iteratively performed. Therefore, as nano void 104 is uniformly distributed within the insulating film 102, the insulating film 102 having a low dielectric constant can be formed to have a target thickness.

Nano void 104 is an air bubble made of air and has a dielectric constant of 1. The dielectric constant of the insulating film 102 is lowered while this nano void 104 is distributed within the insulating film 102. Meanwhile, nano void 104 is formed to have a very small nano size while nano void 104 is uniformly distributed within the insulating film 102. Thus, not only the dielectric constant of the insulating film 102 can be lowered but also the mechanical strength of the insulating film 102 can be kept intact.

Thereby, the low-dielectric insulating film 102 that can be applied to the nano technology is formed.

As mentioned above, according to the present invention, in a process of forming an insulating film, a plurality of nano void are formed within the insulating film by applying a radio frequency power including a short pulse wave so that incomplete reaction is made upon a gas phase reaction. Therefore, the present invention has an advantageous effect that it can form a low-dielectric insulating film that can be applied to the nano technology.

Further, the dielectric constant of the insulating film can be controlled by adjusting a first radio frequency power.

Furthermore, the low-dielectric insulating film can be formed by applying the process of the present invention even to the existing deposition equipment for forming the insulating film having a dielectric constant of about 2.7. Thus, the present invention has an outstanding effect that it can reduce initial facility investment cost.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of forming an insulating film in a semiconductor device, comprising the steps of:
   mounting the semiconductor substrate in which a lower structure is formed into the deposition equipment;
   supplying a source gas containing silicon component and a reaction gas containing oxygen component into the deposition equipment;
   applying radio frequency powers which are mixture of a first radio frequency power having a short pulse wave generated from a first RF device with a second radio frequency power having a background pulse wave generated from a second RE device:
   generating incomplete gas phase reaction during the time when the first radio frequency power is applied, so that an insulating film including nano particles are deposited; and
   oxidizing the nano particles during the time when the first radio frequency power is not applied, so that nano voids are formed within the insulating film, and
   wherein the first radio frequency power has low amplitude and the second radio frequency power has high amplitude.

2. The method as claimed in claim 1, further comprising the step of after the semiconductor substrate is mounted on to the deposition equipment, controlling an internal pressure of the deposition equipment to be a deposition pressure while injecting insert gas into the deposition equipment before the source gas and the reaction gas are supplied.

3. The method as claimed in claim 1, wherein the source gas includes alkyl silane gas including tri-methylsilane ($SiH(CH_3)_3$) gas or tetra-methylsilane ($SiH(CH_3)_4$) gas.

4. The method as claimed in claim 3, wherein the flow rate of supplying alkyl silane gas is 200 through 1000 sccm.

5. The method as claimed in claim 1, wherein $N_2O$ gas is used as the reaction gas and wherein the flow rate of supplying the reaction gas is 1000 through 5000 sccm.

6. The method as claimed in claim 1, wherein the size and distribution of the nano particles are controlled according to a period of the first radio frequency power.

7. The method as claimed in claim 1, wherein the size of the nano particles is controlled according to a pulse width of the first radio frequency power.

8. The method as claimed in claim 1, wherein the degree that the gas phase reaction is formed by incomplete reaction is controlled according to a amplitude of the first radio frequency power.

9. The method as claimed in claim 1, wherein the first radio frequency power is 100 through 300 W and the second radio frequency power is 500 through 2000 W.

10. The method as claimed in claim 1, wherein the nano particles are made of SiCxHy.

11. The method as claimed in claim 1, wherein the insulating film is made of SiOCH.

12. A method of forming an insulating film in a semiconductor device, comprising the steps of:
    mounting the semiconductor substrate in which a lower structure is formed into the deposition equipment;
    supplying a source gas containing silicon component and a reaction gas containing oxygen component into the deposition equipment;
    depositing the insulating film by using plasma wave RF;
    applying a first radio frequency power having a short pulse wave RF generated from a first RF device with a second radio frequency power having a background wave RF generated from a second RF device to form nano particles within the insulating film; and
    applying the second radio frequency power only to form nano voids within the insulating film, and
    wherein the first radio frequency powers is periodically iteratively applied, the step of forming the nano particle and the step of forming nano void are iteratively performed.

13. The method as claimed in claim 12, wherein the source gas includes alkyl silane gas including tri-methylsilane ($SiH(CH_3)_3$) gas or tetra-methylsilane ($SiH(CH_3)_4$) gas.

14. The method as claimed in claim 12, wherein in the nano particles are made by incomplete gas phase reaction and the nano voids are made by oxidizing the nano particles due to a oxygen radical.

15. The method as claimed in claim 12, wherein the short pulse wave RF has low amplitude and the background wave RF has high amplitude.

16. The method as claimed in claim 12, wherein size and distribution of the nano particles are controlled according to a period of the short pulse wave RF.

17. The method as claimed in claim 12, wherein the size of the nano particles are controlled according to a pulse width of the short pulse wave RF and the size of the nano particles are in proportion to the pulse width of the short pulse wave RF.

18. The method as claimed in claim 16, wherein if the period of the short pulse wave RF is increased, the size of the nano particles is increased and if the period of the short pulse wave RF is reduced, the size of the nano particles is reduced.

* * * * *